United States Patent
Hunt

[19]
[11] Patent Number: 6,037,843
[45] Date of Patent: Mar. 14, 2000

[54] CONTROLLABLE REACTANCE CIRCUIT FOR AN INTEGRATED CIRCUIT

[75] Inventor: Kenneth Stephen Hunt, Crowthorne, United Kingdom

[73] Assignee: LSI Logic Corporation, Milpitas, Calif.

[21] Appl. No.: 09/175,605

[22] Filed: Oct. 20, 1998

[30] Foreign Application Priority Data

Oct. 21, 1997 [GB] United Kingdom ............... 9722206

[51] Int. Cl.[7] .............................. H03B 5/02; H03B 5/12; H03H 11/48; H03L 7/08; H03L 7/099
[52] U.S. Cl. ............................ 331/177 V; 331/36 C; 331/117 FE; 331/116 FE; 331/111; 333/214
[58] Field of Search ........................... 331/36 C, 36 R, 331/36 L, 116 R, 116 FE, 117 R, 117 FE, 111, 117 D, 177 R, 177 V, 181; 333/214

[56] References Cited

U.S. PATENT DOCUMENTS

| | | | |
|---|---|---|---|
| 4,399,561 | 8/1983 | Lunn et al. | 455/266 |
| 4,587,500 | 5/1986 | Tanaka et al. | 333/213 |
| 4,602,224 | 7/1986 | Arimoto et al. | 332/16 T |
| 5,510,755 | 4/1996 | Kodrnja et al. | 331/177 R |
| 5,559,474 | 9/1996 | Matsumoto et al. | 331/17 |
| 5,745,012 | 4/1998 | Oka et al. | 331/68 |
| 5,955,929 | 9/1999 | Moon et al. | 331/57 |

*Primary Examiner*—David Mis
*Attorney, Agent, or Firm*—Oppenheimer Wolff & Donnelly

[57] ABSTRACT

A controllable reactance implemented within an integrated circuit includes a first sub-circuit (20) comprising a reactive element, for example a capacitor 12, coupled in series with a transistor (14). A controllable current source (16) injects a controllable bias current through the transistor (14) to vary the effective resistance of the transistor (14) and hence the effective complex impedance of the capacitor combination. A second transistor (18) amplifies the current to increase the effective capacitance. Preferably, a second sub-circuit (24) includes corresponding components (26, 28, 30) to mirror the real component of the current flowing in the first sub-circuit (20), and transistors (32 and 34) to reflect an inverse current to the coupling node line (22) to cancel the real component of the current at the node, to thus simulate a purely capacitive circuit. An oscillator embodying this circuit is also disclosed. The invention can provide a controllable capacitance without the need for a conventional varactor diode.

24 Claims, 2 Drawing Sheets

CONTROLLABLE REACTANCE CIRCUIT FOR AN INTEGRATED CIRCUIT

FIELD OF INVENTION

This invention relates to a controllable reactance circuit for implementing within an integrated circuit. The invention is particularly suitable for simulating a variable or controllable capacitance, but it is not limited to this.

ACKNOWLEDGEMENT OF PRIOR ART

The most common implementation of a variable capacitance is by the use a varactor diode. For integrated circuit applications, the varactor is usually an external component with any necessary external support components. When reversed biased, the diode has a large depletion layer at its junction to provide a usable capacitance across the junction. The voltage across the diode determines the depth of the depletion layer and hence the magnitude of the capacitance.

However, varactor diodes are relatively expensive and are problematic for circuit design. Firstly, varactors have extremely large tolerance values, which means that individual characteristics can vary widely. Two identically "rated" varactors may have such different characteristics that one might provide the rated capacitance value at the upper end of its usable range, while the other may provide the same capacitance value at the very bottom of its usable range. Such wide variation means that it can be difficult to provide predictable circuit performance. The usable range of the varactor (in terms of the capacitances achievable) is also rather limited.

Moreover, varactors generally require a large supply voltage for control. The use of a varactor in a preferred single (low voltage) supply system is generally impractical as the varactor requires a separate high voltage source often higher than that for the rest of the support circuitry (particularly for CMOS circuitry). In addition, since a varactor is a two-terminal device, a large DC blocking capacitor is required to isolate the control voltage from the rest of the circuit. This further increases the cost and the number of external components required.

As mentioned above, varactors are generally used as external components, since the varactor manufacturing process makes it inconvenient and more expensive to produce a varactor as an internal, or on-board, device within an integrated circuit. Furthermore, internal varactors tend to have even worse characteristics (i.e. less variable range, and greater tolerance).

In modern circuits where large scale integration is used, the manufacturing cost of the circuit is becoming increasingly dependent on the number of external components employed. Moreover, where space is premium, there is very little room for external circuit components. Accordingly it would be desirable to provide a controllable capacitance (or other reactive element) which can be implemented internally in an integrated circuit.

The present invention has been devised bearing the above problems in mind.

SUMMARY OF THE INVENTION

In a first aspect, the invention provides an integrated circuit comprising a reactive circuit element coupled in series with a transistor, and means for injecting a bias current through the transistor thereby to control the effective resistance of the transistor and the effective impedance of the combination of the reactive circuit element and the transistor.

With such an arrangement, the current flowing through the reactive element and the transistor is made up of a real (in phase) component and an imaginary (phase quadrature) component. Varying the bias current injected through the transistor varies the effective resistance of the transistor, which in turn varies the phase relationship of the real and imaginary components of the current. Since a variation of the phase relationship is equivalent to a change in impedance, the effective reactance can thus be controlled.

The reactive element may be formed by a passive device implemented within the integrated circuit, or by an active circuit which simulates the reactance. In one form, the reactive element is formed by an on-chip passive capacitor.

Preferably, an amplifier is provided to amplify the current. In the preferred embodiment, the amplifier consists of a second transistor coupled to the series combination of the reactive element and the first transistor. The input to the first transistor is based on a combination of the real and imaginary components of the current through the reactive element, and the bias current from the current source. The amplifier enables the circuit to synthesise a larger reactance than that of the reactive element, and can increase the achievable range of reactance values. This is especially advantageous in enabling a relatively large reactance to be synthesised without having to devote substantial chip area to the implementation of a large reactive element.

Preferably, a second sub-circuit is provided for mirroring the real component of the current in the first sub-circuit, and for producing a current to cancel that real component, leaving only the imaginary component of the current. This enables the circuit to synthesise a purely reactive impedance (i.e. purely capacitive or inductive). It also avoids the need for DC blocking components in connections to other circuits or sub-circuits, allowing simple DC coupling.

In a closely related second aspect, the invention provides an integrated circuit comprising at least one first sub-circuit coupled to a node, and at least one second sub-circuit coupled to the node, the one or more first sub-circuits producing a current at the node including a real component and an imaginary component, and the one or more second sub-circuits producing an inverse current at the node equal in magnitude and opposite to the real component produced by the one or more first sub-circuits, to thereby cancel the real component of the current at the node.

As explained above, this can provide a convenient technique for removing the DC component from a circuit for synthesising a purely reactive circuit element, such as a capacitance or an inductance. The first sub-circuit may include circuitry providing a complex impedance, for example, a controllable or variable complex impedance. The second sub-circuit may be used to mirror the real component of the current in the first sub-circuit, and to cancel that current at the node.

In a preferred form, the second sub-circuit may include one or more first circuit elements which produce a current equal to (and in the same sense as) the real current component in the first sub-circuit, and one or more circuit elements for inverting the current to produce a negative or opposite current to the real current component in the first sub-circuit. In a particularly preferred form, the one or more first circuit elements of the second sub-circuit may mirror or duplicate respective circuit elements used in the first sub-circuit (but without the reactive element or elements, for example).

DESCRIPTION OF THE DRAWINGS

Embodiments of the invention are now described by way of example only, with reference to the accompanying drawings, in which.

DESCRIPTION OF PREFERRED EMBODIMENTS

Figure 1:
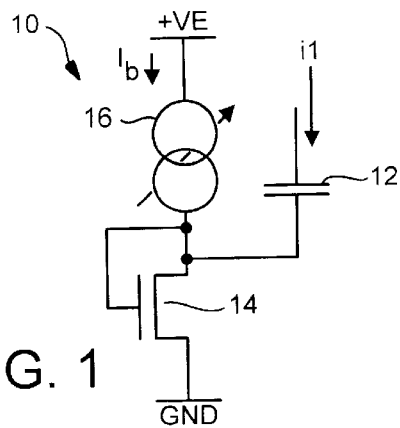
FIG. 1 is a schematic circuit diagram illustrating the principles of the design as a building block.

Referring to FIG. 1, the building block circuit 10 consists of a reactive element in the form of a fixed capacitance 12 coupled in series with a transistor 14 to ground potential. A controllable current source 16 is coupled to the gate and drain of the transistor 14 to inject a controllable bias current $I_b$ through the transistor 14, and hence control its effective resistance.

Figure 2:
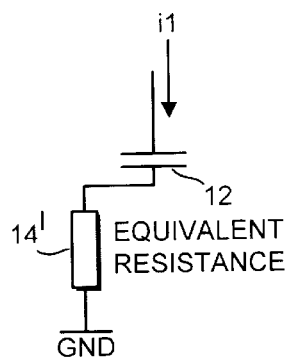
FIG. 2 is a schematic circuit diagram illustrating the equivalent circuit of FIG. 1 for AC signals.

Referring to FIG. 2, the effective circuit for AC signals is the capacitor 12 coupled in series with a variable resistance 14' (formed by the transistor 14) to ground. The current $I_1$ flowing through the series arrangement is made up of a real (in phase) part and an imaginary (quadrature phase) part. The phase relationship of the real and imaginary parts (and hence the effective capacitance of the series circuit) can be controlled by increasing or decreasing the bias current through the transistor 14 forming the variable resistance 14'.

Figure 3:
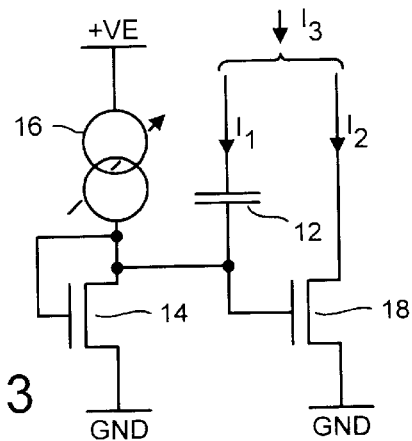
FIG. 3 is a schematic circuit diagram illustrating a modified circuit based on FIG. 1.

FIG. 3 shows a development of the circuit of FIG. 1 by the addition of a second transistor 18 to mirror and amplify the current in the first transistor 14. The gate of the second transistor 18 is coupled to the drain of the first transistor 14, and the current $I_2$ flowing through the second transistor 18 is proportional to the current in the first transistor 14, the latter being made up of $I_1$ (real and imaginary parts) and the bias current $I_b$ supplied by the current source 16. The degree of amplification can be controlled by the selection of transistor scaling properties. The total current $I_3$ drawn by the circuit is $I_3=I_1+I_2$, and includes an imaginary component consisting of the original imaginary current component through the capacitor 12, and the amplified imaginary current component. This enables larger capacitors to be synthesised even though the reactive element 12 may only be a relatively small capacitor, and it also increases the useful tuning or control range of the circuit. Although not illustrated, further mirror/amplification stages could also be used if desired.

Figure 4:
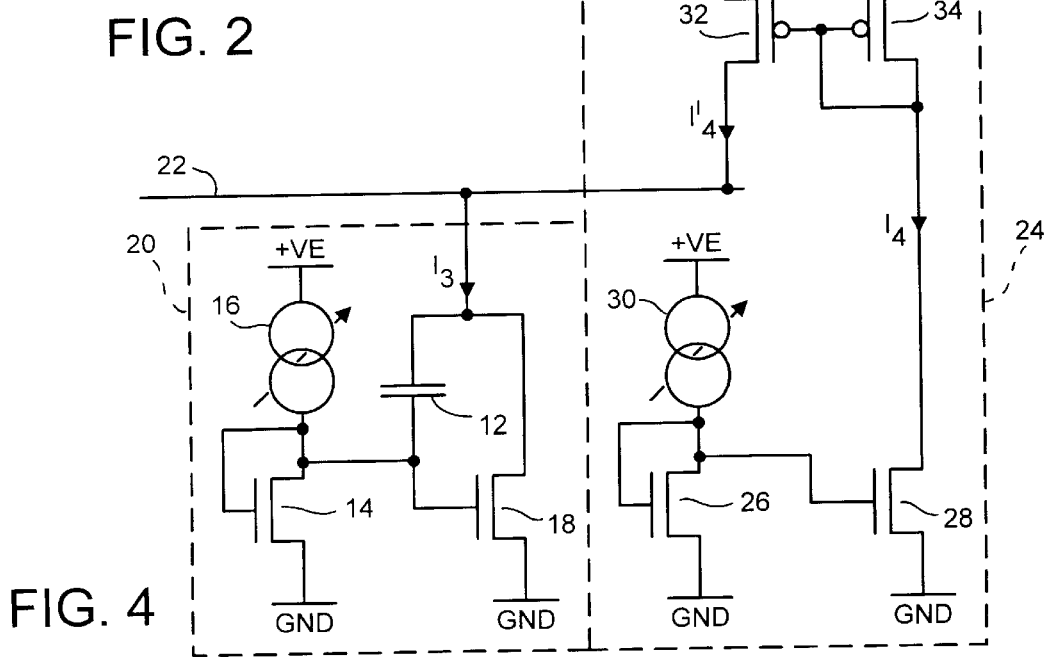
FIG. 4 is a schematic circuit diagram illustrating a further modified circuit based on FIG. 3.

FIG. 4 illustrates a further development of the circuit of FIG. 3. In FIG. 4, the circuit part within the broken line 20 is the same as that of FIG. 3, and need not be described further. As explained above, the current $I_3$ flowing into (or drawn by) the sub-circuit 20 from node line 22 includes both a real component and an imaginary component.

In this embodiment, a second sub-circuit 24 is provided for injecting on to the node line 22 a current having a real component which substantially matches, and hence cancels, the real component drawn by the first sub-circuit 20. Thus the net "external" current flowing into node line 22 is purely imaginary, and the input impedance at node line 22 is purely reactive (or capacitive, in the present embodiment).

The second sub-circuit 24 consists of a third transistor 26 which matches the first transistor 14, a fourth transistor 28 which matches the second transistor 18, and a controllable current source 30 which matches the current source 16 of the circuit 20. The third transistor 26, fourth transistor 28 and the current source 30 are arranged together in a similar manner as the respective components of the first sub-circuit 20 but without the capacitor 12. The second circuit draws a current $I_4$ which is only real (i.e. there is no phase quadrature component), and is substantially equal to the real component of 13.

The second sub-circuit 24 also includes fifth and sixth inverting transistors 32 and 34 coupled back to back, whose function is to "reflect" an inverse of the current $I_4$ on to the node line 22. In other words, the current $I_4$ is in the same sense as 13, and the fifth and sixth transistors 32 and 34 reflect the inverse current $I_4'$ on to the node line 22 to cancel the real component of $I_3$.

The cancelling of the real part of the input current is especially advantageous, as it avoids the need for any DC blocking components, and can provide synthesis of a pure capacitance, even though the transistor 14 behaves as a lossy resistor. The current sources 16 and 30 can easily be controlled from the same control signal, to ensure that the real current component flowing in the first sub-circuit 20 matches that flowing in the second sub-circuit 24 throughout the control range.

Figure 5:
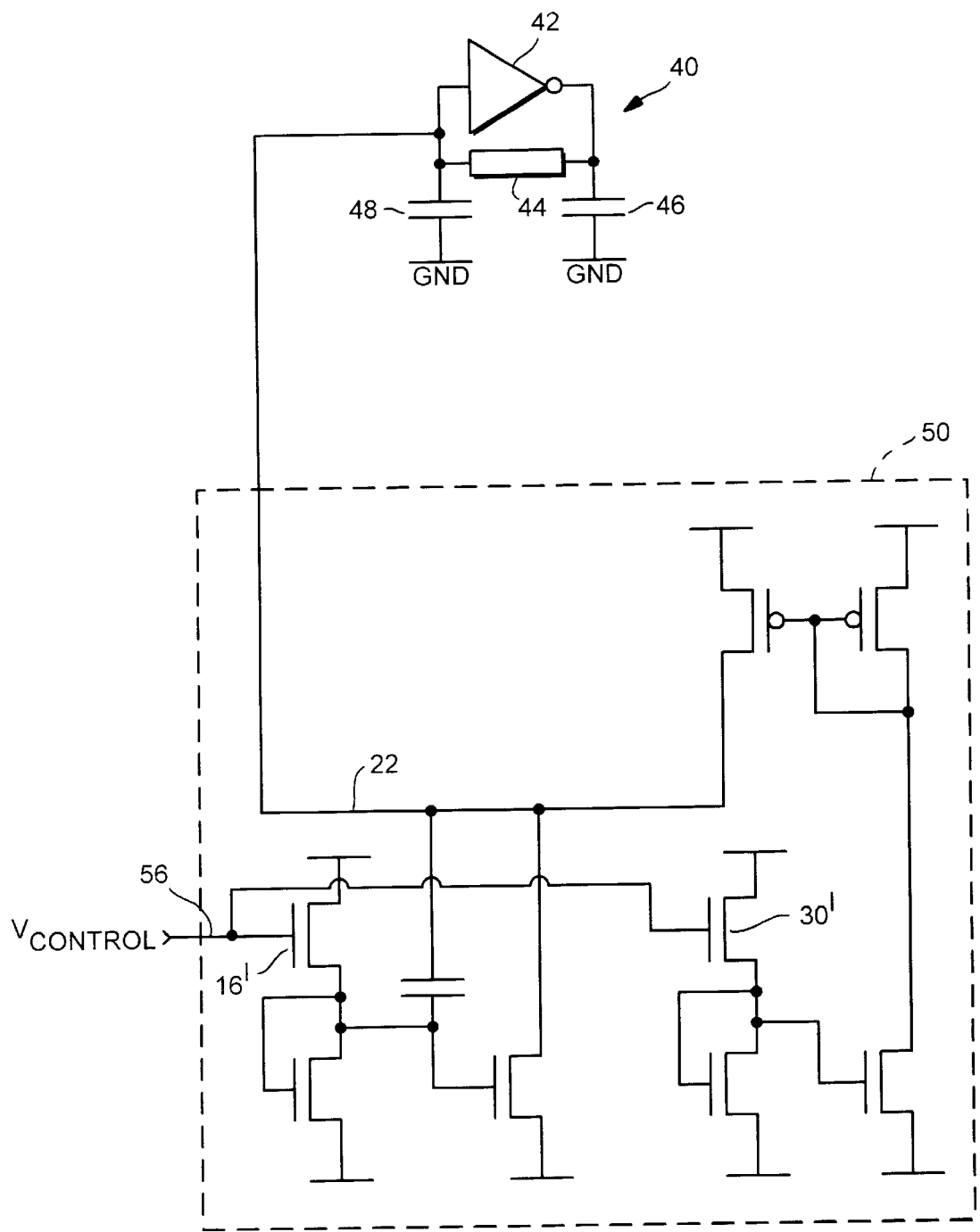
FIG. 5 illustrates an example of an oscillator employing the circuit of FIG. 4.

FIG. 5 illustrates a voltage controlled LC Pierce oscillator 40 employing the circuit of FIG. 4 to achieve frequency control. The oscillator 40 includes an inverting amplifier 42 with a conventional feedback loop formed by a series connected inductor 44, and capacitors 46 and 48 coupled to ground on either side of the inductor. The circuit within broken line 50 is identical to the circuit of FIG. 4, and provides an additional controllable capacitance coupled between ground and the input of the amplifier 42. In the circuit 50, the controllable current sources are embodied by transistors 16' and 30'; these transistors are substantially identical, and their gates are coupled together to a control line 56 to which is provided a control voltage. The control voltage controls the current in, or "injected" by, each current source transistor 16' and 30'.

It will be appreciated that the illustrated embodiments can be produced using components which are straightforward to implement on an integrated circuit, and that the designs are not dependent on the semiconductor technology used. The invention is especially suitable for implementation in CMOS, but may be implemented in other technologies.

It will be further appreciated that the invention, particularly as illustrated in the preferred embodiments, can provide a controllable or variable capacitance implementable on an integrated circuit, which can provide at least equivalent performance (and generally significantly better performance) than a conventional integrated or discrete varactor diode. By implementing the capacitor as an internal component, the number of external components can be significantly reduced. This is especially important for reducing net circuit costs, and for applications (such as mobile telecommunications) where circuit board space is premium. Furthermore, the problems associated with varactors, namely unacceptably large tolerances and large supply voltage requirements, can be almost completely eliminated. Moreover, all of the circuit components in the integrated circuit can be accurately modelled, leading to more predictable designs and reduced development time.

Typical applications for the invention include (but are not limited to) voltage controlled oscillators (VCO's) and phase locked loops (PLL's), for example, using crystals, ceramic resonators or inductors in combination with a capacitance to form a tuned circuit. Such circuits may be found in a wide variety of application products, especially in telecommunications (for example, phones, set-top decoders).

It will be appreciated that the foregoing description is merely illustrative of preferred examples of the invention and that many modifications and developments may be made within the scope of the invention. Although features believed to be of particular importance have been identified in the claims, the Applicant claims protection for any novel idea, feature and/or combination of features described herein and/or illustrated in the drawings, irrespective of whether emphasis has been placed thereon.

I claim:

1. An integrated circuit comprising a sub-circuit having a controllable reactance, the sub-circuit comprising a reactive circuit element coupled in series with a transistor, and means for injecting a bias current through the transistor thereby to control the effective resistance of the transistor and the effective impedance of the combination of the reactive circuit element and the transistor.

2. An integrated circuit according to claim 1, wherein the reactive circuit element is capacitive.

3. An integrated circuit according to claim 1, wherein the reactive circuit element is a passive capacitor device.

4. An integrated circuit according to claim 1, wherein the reactive circuit element has a generally fixed reactance.

5. An integrated circuit according to claim 1, wherein the means for injecting the bias current comprises a current regulating transistor.

6. An integrated circuit according to claim 1, wherein the sub-circuit further comprises an amplifier coupled to the series combination of the reactive element and the transistor for producing a current including an amplified phase quadrature component.

7. An integrated circuit according to claim 1 further comprising a second sub-circuit coupled to the first sub-circuit at a node, the second sub-circuit being operable to produce a current equal in magnitude and opposite to the real component of the current flowing between the node and the first sub-circuit, to thereby cancel the real component of the current at the node.

8. An integrated circuit according to claim 7, wherein the second sub-circuit includes one or more first circuit elements for generating a current equal and in the same sense as the real component of the current in the first sub-circuit, and one or more second circuit elements for producing therefrom an inverse output current in the opposite sense.

9. An integrated circuit according to claim 8, wherein the one or more first circuit elements of the second sub-circuit are elements which mirror respective circuit elements of the first sub-circuit.

10. An integrated circuit according to claim 8, wherein the one or more first circuit elements of the second sub-circuit include a transistor coupled in series with a controllable current source for injecting a current through the transistor.

11. An integrated circuit according to claim 10, wherein the one or more first circuit elements of the second sub-circuit include an amplifier coupled to the series arrangement of the transistor and current source, to produce an amplified current signal.

12. An integrated circuit according to claim 10, wherein a current source in the first sub-circuit, and the current source in the second sub-circuit, are controlled by a common control signal.

13. An integrated circuit according to claim 1, wherein the first sub-circuit forms part of an oscillator circuit.

14. An integrated circuit according to claim 1, wherein the first sub-circuit forms part of a phase locked loop circuit.

15. An integrated circuit comprising at least one first sub-circuit coupled to a node, and at least one second sub-circuit coupled to the node, the one or more first sub-circuits producing a current at the node including a real component and an imaginary component, and the one or more second sub-circuits producing an inverse current at the node equal in magnitude and opposite to the real component produced by the one or more first sub-circuits, to thereby cancel the real component of the current at the node.

16. An integrated circuit according to claim 15, wherein the first sub-circuit provides a controllable complex impedance.

17. An integrated circuit according to claim 15, wherein the integrated circuit includes one first sub-circuit, and one second sub-circuit for each node.

18. An integrated circuit according to claim 17, wherein the second sub-circuit includes one or more first circuit elements for generating a current equal and in the same sense as the real component of the current in the first sub-circuit, and one or more second circuit elements for producing therefrom an inverse output current in the opposite sense.

19. An integrated circuit according to claim 18, wherein the one or more first circuit elements of the second sub-circuit are elements which mirror respective circuit elements of the first sub-circuit.

20. An integrated circuit according to claim 18, wherein the one or more first circuit elements of the second sub-circuit include a transistor coupled in series with a controllable current source for injecting a current through the transistor.

21. An integrated circuit according to claim 20, wherein the one or more first circuit elements of the second sub-circuit include an amplifier coupled to the series arrangement of the transistor and current source, to produce an amplified current signal.

22. An integrated circuit according to claim 20, wherein a current source in the first sub-circuit, and the current source in the second sub-circuit, are controlled by a common control signal.

23. An integrated circuit according to claim 15, wherein the first sub-circuit forms part of an oscillator circuit.

24. An integrated circuit according to claim 15, wherein the first sub-circuit forms part of a phase locked loop circuit.

* * * * *